United States Patent
Wu et al.

(10) Patent No.: US 10,168,724 B2
(45) Date of Patent: Jan. 1, 2019

(54) APPARATUSES AND METHODS FOR PROVIDING REFERENCE VOLTAGES

(71) Applicant: Micron Technology, Inc., Boise, ID (US)

(72) Inventors: Jun Wu, Su Zhou (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 289 days.

(21) Appl. No.: 14/777,854

(22) PCT Filed: Jun. 15, 2015

(86) PCT No.: PCT/CN2015/081435
§ 371 (c)(1),
(2) Date: Sep. 17, 2015

(87) PCT Pub. No.: WO2016/201596
PCT Pub. Date: Dec. 22, 2016

(65) Prior Publication Data
US 2017/0017252 A1    Jan. 19, 2017

(51) Int. Cl.
*G05F 3/26* (2006.01)
*H03M 1/76* (2006.01)

(52) U.S. Cl.
CPC .............. *G05F 3/26* (2013.01); *H03M 1/76* (2013.01)

(58) Field of Classification Search
CPC ............. G05F 3/26; G05F 1/575; H03M 1/12
See application file for complete search history.

(56) References Cited

U.S. PATENT DOCUMENTS

| | | |
|---|---|---|
| 6,147,549 A | 11/2000 | Ohno |
| 7,474,245 B1 | 1/2009 | Wang et al. |
| 7,504,979 B1 | 3/2009 | Knausz et al. |
| 8,446,142 B2 | 5/2013 | Bucur et al. |

(Continued)

FOREIGN PATENT DOCUMENTS

| | | |
|---|---|---|
| CN | 101063754 A | 10/2007 |
| JP | 11121694 A | 4/1999 |
| WO | 2016202185 A1 | 12/2016 |

OTHER PUBLICATIONS

International Search Report and Written Opinion for PCT Int'l Patent Appl. No. PCT/CN2016/084933 dated Sep. 14, 2016.

(Continued)

*Primary Examiner* — Jue Zhang
(74) *Attorney, Agent, or Firm* — Dorsey & Whitney LLP

(57) ABSTRACT

A reference voltage generator is disclosed that may provide a plurality of reference voltages. A reference voltage generator may include a voltage divider, a multiplexer coupled to the voltage divider, an operational amplifier that may receive a voltage from the multiplexer, and a plurality of resistors that may receive an output from the operational amplifier. The reference voltages may be provided from output terminals coupled to the resistors. A reference voltage generator may include a voltage divider, two multiplexers coupled to the voltage divider, an operational amplifier coupled to each multiplexer, and a plurality of resistors coupled between the outputs of the two operational amplifiers. Reference voltages may be provided from output terminals coupled to the resistors.

13 Claims, 6 Drawing Sheets

(56) References Cited

U.S. PATENT DOCUMENTS

| | | |
|---|---|---|
| 2002/0192892 A1 | 12/2002 | Micheloni et al. |
| 2005/0024129 A1* | 2/2005 | Jang .................. G05F 1/465 |
| | | 327/541 |
| 2006/0050036 A1 | 3/2006 | Miura |
| 2007/0164888 A1 | 7/2007 | Park |
| 2007/0217271 A1* | 9/2007 | Kutz .................. G11C 5/147 |
| | | 365/189.09 |
| 2007/0274116 A1* | 11/2007 | Choy ................ G11C 11/5628 |
| | | 365/18 |
| 2007/0296388 A1 | 12/2007 | Sasaki et al. |
| 2008/0278359 A1 | 11/2008 | Wojewoda |
| 2009/0230972 A1 | 9/2009 | Bucar et al. |
| 2010/0182348 A1 | 7/2010 | Okutani |
| 2012/0013385 A1 | 1/2012 | Kwon |
| 2014/0253423 A1 | 9/2014 | Kinsho |

OTHER PUBLICATIONS

"International Search Report and Written Opinion received for Appl. PCT/CN2015/081435 dated Aug. 26, 2015".

\* cited by examiner

APPARATUSES AND METHODS FOR PROVIDING REFERENCE VOLTAGES

RELATED APPLICATIONS

This application is a 371 National Stage application claiming priority to PCT Application No. PCT/CN2015/081435, filed Jun. 15, 2015, which application is incorporated herein by reference in its entirety, for any purpose.

BACKGROUND

Reference voltage generators are used in a variety of applications. For example, reference voltages may be used for digital-to-analog and analog-to-digital applications. Voltage generators may be used for calibration of data and command-address lines in memory devices.

In some applications, it may he desirable to provide a plurality of reference voltages. For example, a device may use more than one reference voltage during operation. Other applications may also benefit from multiple reference voltages.

SUMMARY

An example apparatus according to an embodiment of the disclosure may include a multiplexer that may be configured to receive a plurality of voltages and provide a selected voltage, an operational amplifier that may be configured to receive the selected voltage at anon-inverting input and provide a first reference voltage from an output, a resistor coupled to the output of the operational amplifier, a first adjustable resistor coupled to the resistor, wherein a second reference voltage may be provided from between the resistor and the first adjustable resistor, and a second adjustable resistor coupled to the first adjustable resistor and to an inverting input of the operational amplifier, the second adjustable resistor may be configured to maintain a constant current through the resistor.

Another example apparatus according to an embodiment of the disclosure may include a first operational amplifier that may be configured to receive a first selected voltage at a non-inverting input and provide a first reference voltage from a first output, wherein the first output may be coupled to an inverting input of the first operational amplifier, a second operational amplifier that may be configured to receive a second selected voltage at a non-inverting input and provide a second reference voltage from a second output, wherein the second output may be coupled to an inverting input of the second operational amplifier, and a voltage divider may be coupled between the first output and the second, the voltage divider may he configured to provide a plurality of reference voltages, each of the plurality of reference voltages may have a respective voltage between a voltage of the first output and a voltage of the second output.

An example method according to an embodiment of the disclosure may include providing a selected voltage to an operational amplifier and outputting a first reference voltage; dividing with a first resistor the first reference voltage to provide a plurality of reference voltages; providing an output of the first resistor as feedback to the operational amplifier; and maintaining a constant current through the resistor.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Examples of reference voltage generators are described herein that may allow for multiple reference voltages to be provided at the same time. The reference voltage generators may allow a voltage difference between the multiple reference voltages to be held constant, even if the voltage levels of the reference voltages is changed. This may allow voltage ratios within and/or between circuits coupled to the reference voltages to be maintained across a range of voltage levels. The voltage levels of the reference voltages may be controlled, at least in part, by providing a selected voltage from a voltage divider. The selection of voltage levels and constant difference between reference voltages may facilitate calibration of circuits and/or devices.

Figure 1:
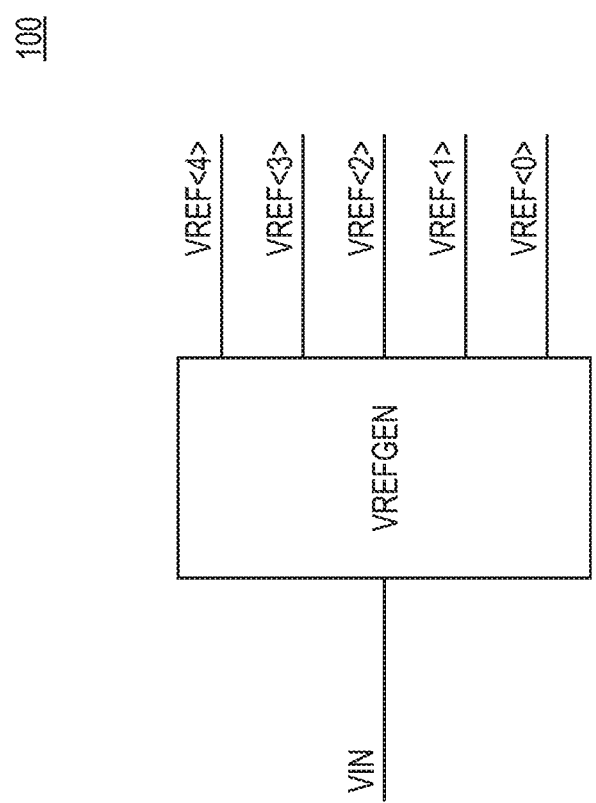
FIG. 1 is a block diagram of a reference voltage generator according to an embodiment of the disclosure.

FIG. 1 illustrates an apparatus including a reference voltage generator (VrefGen) 100 according to an embodiment of the disclosure. As used herein, apparatus may refer to, for example, a circuit, an integrated circuit, a memory device, a memory system, an electronic device or system, a smart phone, a tablet, a computer, a server, etc. VrefGen 100 may receive an input voltage Vin and provide a plurality of reference voltages Vref<0-4>. VrefGen 100 may maintain a constant voltage difference between each of the reference voltages Vref<0-4>. For example, the voltage difference between Vref<0> and Vref<1> may be 5 mV. If Vref<0> is set to −10 mV, Vref<1> may be −5 mV. Continuing with this example, if VrefGen 100 is modified such that Vref<0> is set to −12 mV, Vref<1> may be −7 mV. In some embodiments, the voltage difference between the adjacent reference voltages may be equal (e.g., Vref<4>=10 mV, Vref<3>=5 mV, Vref<2>=0 mV, etc.). In some embodiments, the voltage difference between one set of adjacent reference voltages may be different than the voltage difference between a second set of adjacent reference voltages. For example, the voltage difference between Vref<0> and Vref<1> may be 5 mV, and the voltage difference between Vref<1> and may be 10 mV. Other configurations of reference voltages may be possible. VrefGen 100 is shown in FIG. 1 as providing five reference voltages; however, in some embodiments VrefGen 100 may be configured to provide more or fewer reference voltages.

Figure 2:
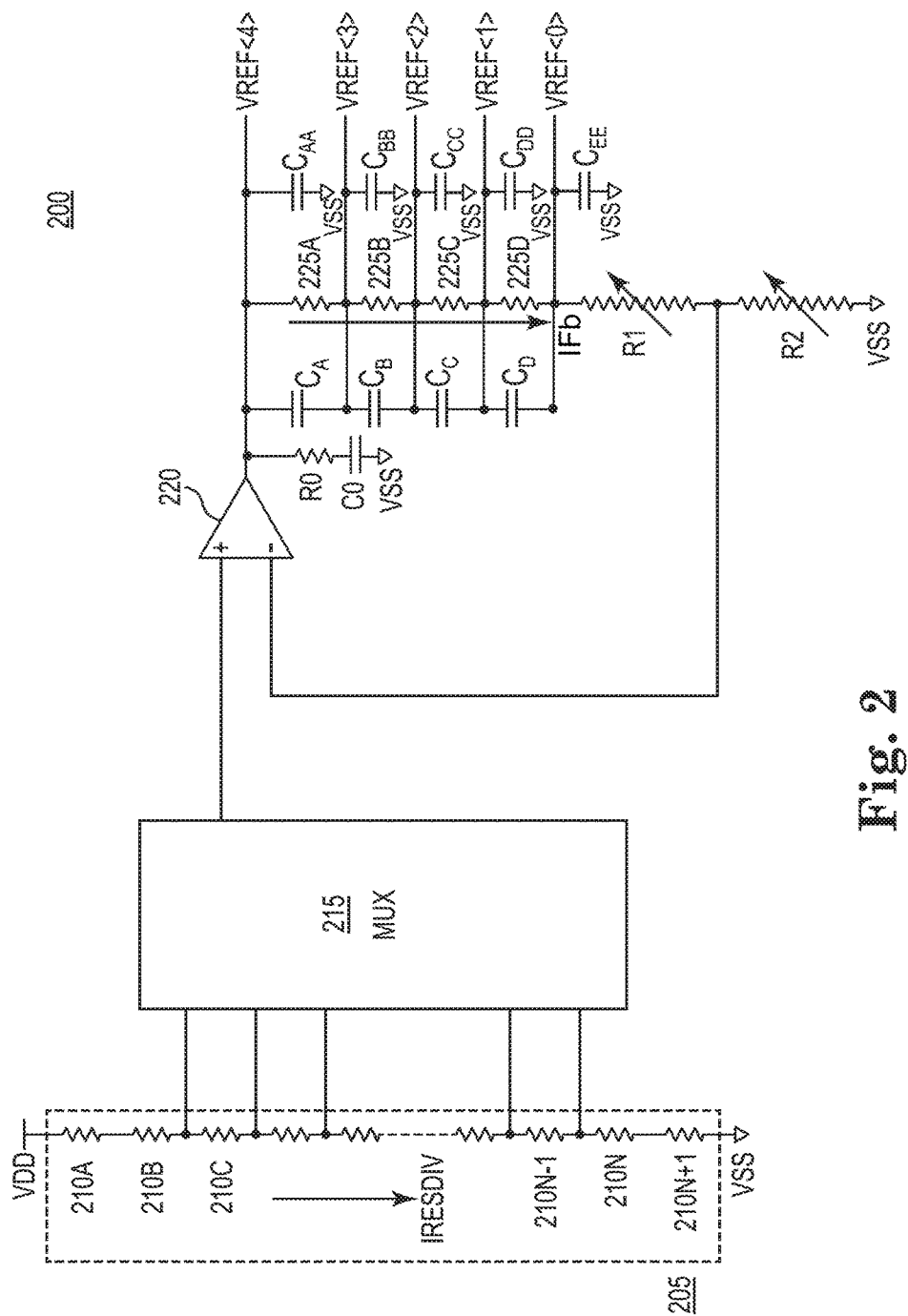
FIG. 2 is a circuit diagram of a reference voltage generator.

FIG. 2 is a circuit diagram of a reference voltage generator 200 according to an embodiment of the disclosure. The reference voltage generator 200 may be used to implement VrefGen 100 shown in FIG. 1 in some embodiments. The reference voltage generator 200 may include a voltage divider 205 coupled to a multiplexer 215. The multiplexer 215 may be coupled to an op-amp 220. The op-amp 220 may be further coupled to a plurality of resistors 225a-d that are coupled in series. The series coupled resistors 225a-d may be coupled to one or more lines for providing reference voltages Vref<0-4>.

The voltage divider 205 may be coupled to a source voltage Vdd (e.g., a positive supply) and a reference voltage Vss e.g., a negative supply, ground, etc.). The voltage divider 205 may include resistors 210a-n+1. The resistors 210a-n+1 may divide the source voltage Vdd to provide one or more voltages. In some embodiments, the current Iresdiv through the resistors 210a-n+1 may be relatively low (e.g. 1-30 µA). Voltage dividers other than that shown in FIG. 2 may also be used. The voltage divider 205 may provide the one or more voltages to the multiplexer 215. The multiplexer 215 may be controlled by a controller (not shown) to provide a voltage from the voltage divider 205 as a selected voltage. The multiplexer 215 may provide the selected voltage to a non-inverting input of an operational amplifier (op-amp) 220. The op-amp 220 may output a voltage to resistors 225a-d.

The resistors 225a-d may act as a voltage divider to provide reference voltages Vref<0-4>. The magnitude of the resistors 225a-d may be chosen to provide a desired voltage difference between each adjacent reference voltage Vref<0-4>. In some embodiments, the resistors 225a-d are equal in magnitude. In some embodiments, the resistors 225a-d are different magnitudes. Although four resistors 225a-d and five reference voltages Vref<04> are shown in FIG. 2, more or fewer resistors and reference voltages may be provided.

An adjustable resistor R1 may be coupled to the resistors 225a-d. The magnitude of resistor R1 may be adjusted to trim op-amp offsets and mismatches. In some embodiments, adjustable resistor R1 may be a trimmed resistor. In some embodiments, adjustable resistor R1 may include a fuse. The adjustable resistor R1 may be coupled to the inverting input of op-amp 220 and an adjustable resistor R2. Adjustable resistor R2 may also be coupled to a reference voltage Vss. The magnitude of R2 may be adjusted to keep the current Ifb through resistors 225a-d constant. Keeping Ifb constant over a range of voltages may allow the reference voltages Vref<0-4> to maintain a constant voltage difference between each reference voltage. The constant voltage difference between each reference voltage may be maintained, for example, when the voltage provided to resistors 225a-d is altered.

In some embodiments, decoupling capacitors (e.g., $C_{AA}$, $C_{BB}$, $C_{CC}$, $C_{DD}$, $C_{EE}$) may be provided (optional) between an output terminal for each reference voltage Vref<0-4> and the reference voltage Vss line. The decoupling capacitors may be chosen based on the loads to which the reference voltages are provided. In some embodiments, decoupling capacitors (e.g., $C_A$, $C_B$, $C_C$, $C_D$) may be provided (optional) between adjacent reference voltage output terminals. The decoupling capacitors between adjacent reference voltage output terminals may be desirable when the voltage provided from the output of the op-amp 220 changes rapidly. The decoupling capacitors between adjacent reference voltage output terminals may decrease the response time of the reference voltage generator 200. In some embodiments, the current Ifb through resistors 225a-d may be relatively high (e.g., 140 µA or higher), which may also decrease the response time of the reference voltage generator 200.

In some embodiments, a resistor R0 and capacitor C0 coupled in series with the reference voltage Vss line may be coupled (optional) to the output terminal of reference voltage Vref<4>. The magnitudes for the resistor and capacitor may be selected to compensate for op-amp 220 (e.g., pole zero tracking frequency compensation). This may provide more stability for voltage generator 200.

Figure 3:
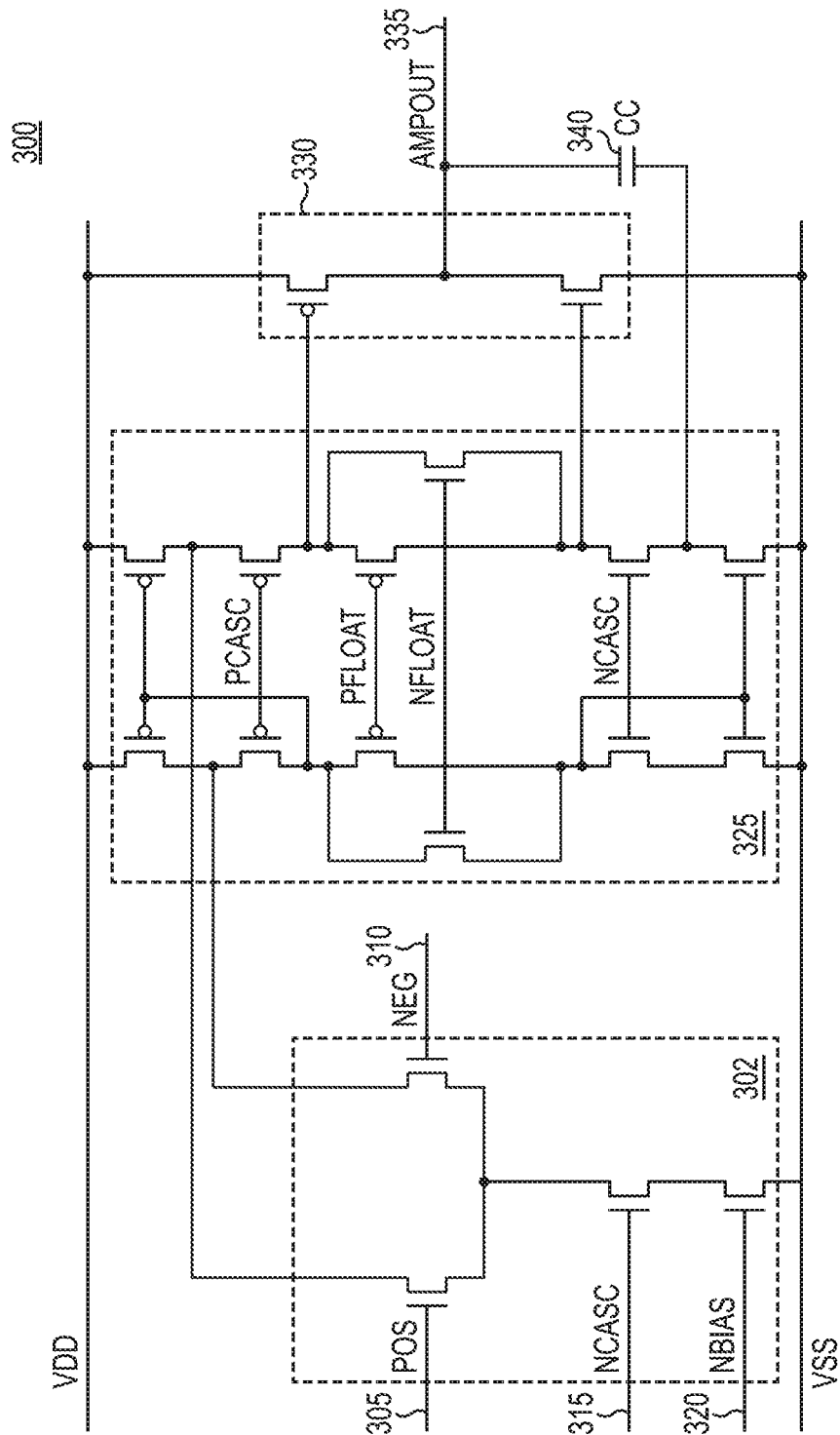
FIG. 3 is a circuit diagram of a Class AB operational amplifier according to an embodiment of the disclosure.

FIG. 3 is a circuit diagram of a Class AB operational amplifier (op-amp) 300 according to an embodiment of the disclosure. The op-amp 300 may be used to implement op-amp 220 illustrated in FIG. 2 in some embodiments. A Class AB op-amp may provide a strong driving strength that may facilitate a fast response time of a reference voltage generator, such as reference voltage generator 200, regardless of whether voltage levels are rising or falling.

The op-amp 300 is a multi-stage op-amp configuration. The op-amp 300 includes an input stage 302. The voltage from a multiplexer, such as multiplexer 215, is provided to the non-inverting input 305 of the input stage 302. A feedback signal may be provided to the inverting input 310 of the input stage 302. The inputs 305, 310 of the input stage 302 may be biased by nCasc and nBias voltages 315, 320 provided to bias transistors of the input stage 302. The input stage 302 provides input voltages to an amplification stage 325. The amplification stage 325 may include one or more transistors configured as one or more current mirrors. Amplification stage 325 may include one or more current mirrors in cascode configuration and/or other configuration. Amplification stage 325 may receive one or more biases voltages pCasc, pFloat, nFloat, nCasc to facilitate stability and/or Class AB performance. The type and number of biases utilized by the amplification stage 325 may vary based on the chosen Class AB op-amp configuration. The output of the amplification stage 325 may be provided to an output stage 330 that provides an output voltage at output 335 of op-amp 300. The output voltage may be provided to a plurality of resistors, such as resistors 225a-d (not shown in FIG. 3). In some embodiments, a capacitor 340 may be coupled between the output 335 and a transistor of the amplification stage 325 to facilitate frequency compensation. Optionally, a resistor may be coupled in series with capacitor 340. The op-amp 300 is provided as a non-limiting example. Other Class AB op-amps may also be used in embodiments of the invention.

Figure 4:
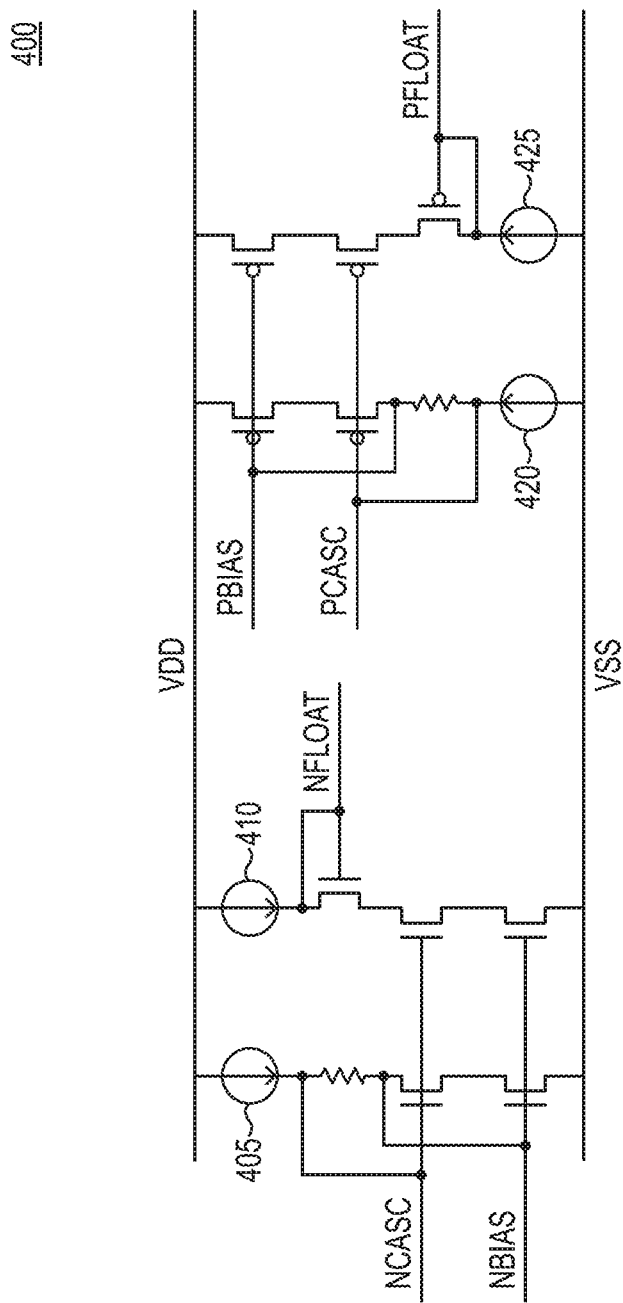
FIG. 4 is a circuit diagram of a bias circuit according to an embodiment of the disclosure.

FIG. 4 is a circuit diagram of a bias circuit 400 according to an embodiment of the disclosure. The bias circuit 400 may be used to provide the bias voltage for op-amp 300 illustrated in FIG. 3. The bias circuit 400 may include transistors, resistors, current sources, and other circuit elements configured to provide various bias voltages. The bias circuit 400 may provide bias voltages nBias, nCasc, nFloat, pBias, pCasc, and pFloat, for example, to op-amp 300. The nCasc and nBias Was voltages may both be generated using current source 405. The nFloat may be generated using current source 410. The pCasc and pBias may be generated using current source 420, and pFloat may be generated using current source 425. In some embodiments one or more of the current sources 405-425 may provide the same current (e.g., 260 µA). In some embodiments, the current sources 405-425 may provide different currents. The bias circuit 400 is provided as anon-limiting example. More or fewer bias voltages may be generated, which may be based on the configuration of the operational amplifier. Other bias circuits may also be used in embodiments of the invention.

Figure 5:
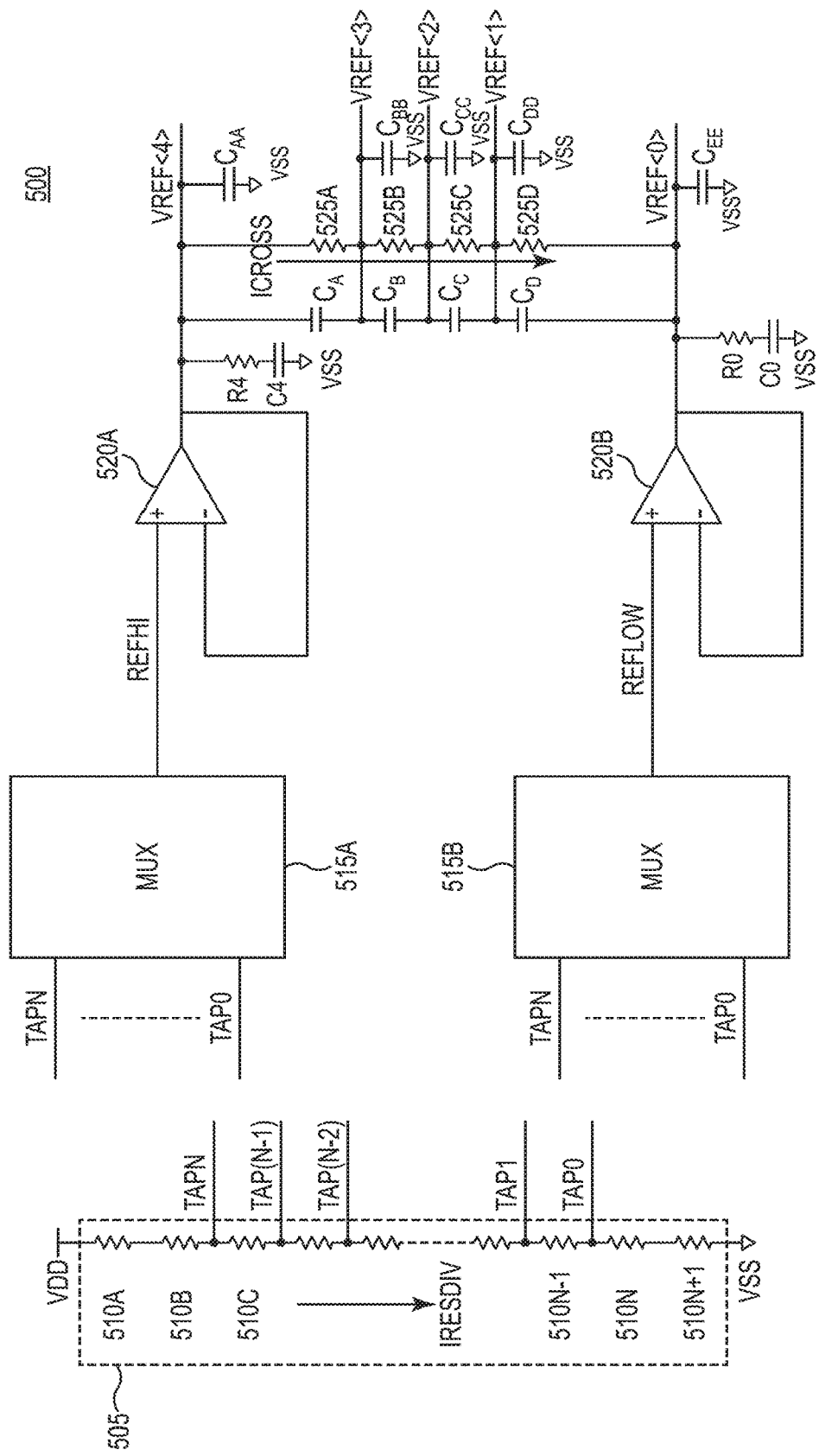
FIG. 5 is a circuit diagram of a reference voltage generator according to an embodiment of the disclosure.

FIG. 5 is a circuit diagram of a reference voltage generator 500 according to an embodiment of the disclosure. The reference voltage generator 500 may be used to implement VrefGen 100 shown in FIG. 1. The reference voltage generator 500 may include a voltage divider 505 coupled to multiplexers 515a-b. Each multiplexer 515a-b may be coupled to a corresponding op-amp 520a-b. The op-amps 520a-b may be further coupled to a plurality of resistors 525a-d coupled in series. The resistors 525a-d may be coupled to one or more lines for providing reference voltages Vref<0-4>.

The voltage divider 505 may be similar to voltage divider 205 illustrated in FIG. 2. The voltage divider 505 may be coupled to a source voltage Vdd and a reference voltage Vss. The voltage divider 505 may include resistors 510a-n+1. The resistors 510a-n+1 may divide the source voltage Vdd into one or more voltages. In some embodiments, the current Iresdiv through the resistors 510a-n+1 may be relatively low (e.g. 1-30 µA). Other voltage dividers may also be used. The voltage divider 505 may provide one or more voltages to multiplexers 515a-b. The multiplexers 515a-b may be operated by one or more controllers (not shown). The multiplexer 515a may provide a voltage RefHi to a non-inverting input of an operational amplifier (op-amp) 520a. The op-amp 520a may provide an output to resistor 525a, The output of op-amp 520a may be fed back to the inverting input of op-amp 520a. The multiplexer 515b may provide a voltage RefLow to a non-inverting input of an op-amp 520b. The op-amp 520b may provide an output to resistor 525d. The output of op-amp 520h may be fed back to the inverting input of op-amp 520b.

The reference voltage generator 500 may be configured so that the output of the op-amp 520a is provided as and the output of op-amp 520b is provided as Vref<0>. The resistors 525a-d may act as a voltage divider and provide reference voltages Vref<0-4>. The magnitude of the resistors 525a-d may be chosen to provide a desired voltage difference between each adjacent reference voltage Vref<0-4>. In some embodiments, the resistors 525a-d are equal in magnitude. In some embodiments, the resistors 525a-d are different magnitudes. In some embodiments, the reference voltage generator 500 may be configured so that Vref<4> is equal to voltage RefHi and Vref<0> is equal to voltage RefLow. Although four resistors 525a-d and five reference voltages Vref<0-4> are shown in FIG. 5, more or fewer resistors and reference voltages may be included in some embodiments.

When the reference voltages Vref<0-4> move from a high level to a low level, the op-amp 520b may provide a strong pull-down driving strength. Similarly, when the reference voltages Vref<0-4> move from a low level to a high level, the op-amp 520a may provide a strong pull-up driving strength. The complementary driving strength of the op-amps 520a-b may decrease the response time of the voltage generator 500. The current Icross through the resistors 525a-d may be relatively high (e.g., 140 µA or higher), which may also decrease the response time of the reference voltage generator 500. The mismatch of op-amps 520a-b may be minimized, which may inhibit current Icross from approaching zero.

In some embodiments, decoupling capacitors (e.g., $C_{AA}$, $C_{BB}$, $C_{CC}$, $C_{DD}$, $C_{EE}$) may be provided (optional) between each output terminal for reference voltages Vref<0-4> and the reference voltage Vss line. The decoupling capacitors may be chosen based on the loads to which the reference voltages are provided. In some embodiments, decoupling capacitors (e.g., $C_A$, $C_B$, $C_C$, $C_D$) may be provided (optional) between adjacent reference voltage output terminals. The decoupling capacitors between adjacent reference voltage output terminals may be desirable when the voltage provided from the outputs of the op-amps 520a-b changes rapidly. The decoupling capacitors between adjacent reference voltage output terminals may decrease the response time of the reference voltage generator 500.

In some embodiments, a resistor R4 and capacitor C4 and/or a resistor R0 and capacitor C0 coupled in series with the reference voltage Vss line may be coupled (optional) to the output terminal of reference voltage Vref<4> and/or Vref<0>, respectively. The resistor and capacitor may be selected to compensate for op-amps 520a-b (e.g., pole zero tracking frequency compensation). This may provide more stability for voltage generator 500.

The reference voltage generators 100, 200, and/or 500 may be used to provide multiple reference voltages at the same time. The reference voltage generators described herein may have a rapid response time even with a large capacitive load on the reference voltage line. In some embodiments, the reference voltage generators 100, 200, and/or 500 described herein may be used for mismatch calibration of input buffers for data DQ and/or command/address of a memory device. The availability of multiple reference voltages at the same time may allow each input buffer to receive a different reference voltage. The ability to select from a variety of voltage levels from a voltage divider with one or more multiplexers may allow for a wide range of reference voltage levels to be used. This may facilitate minimizing the input buffer mismatch. The reference voltage generators 100, 200, and/or 500 may be used in other applications as well.

Figure 6:
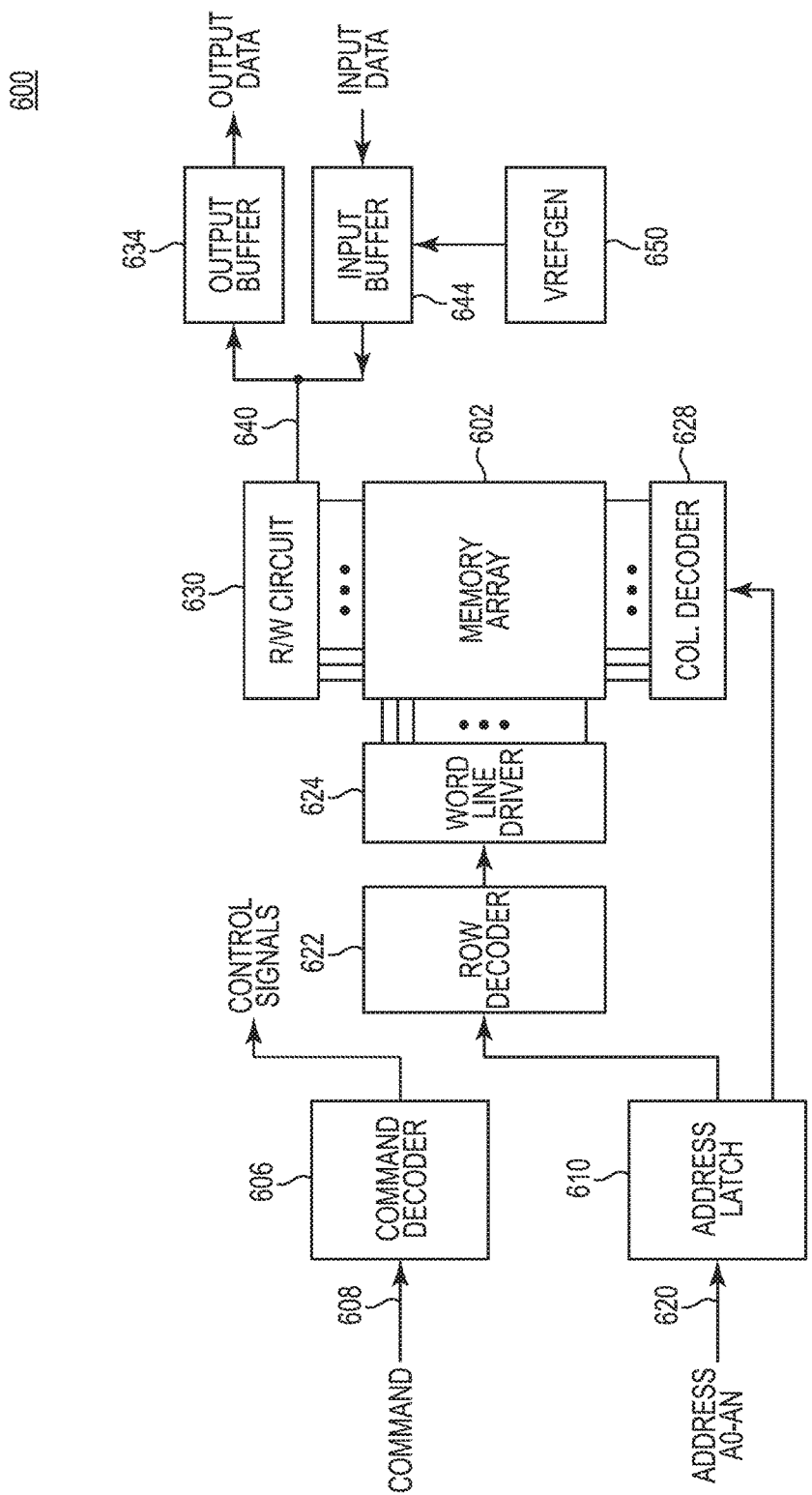
FIG. 6 is a block diagram of a memory according to an embodiment of the disclosure.

FIG. 6 illustrates a memory 600 according to an embodiment of the disclosure. The memory 600 includes an array 602 of memory cells, which may be, for example, volatile memory cells DRAM memory cells, SRAM memory cells), non-volatile memory cells (e.g., flash memory cells), or some other types of memory cells. The memory 600 includes a command decoder 606 that receives memory commands through a command bus 608 and generates corresponding control signals within the memory 600 to carry out various memory operations, The command decoder 606 responds to memory commands applied to the command bus 608 to perform various operations on the memory array 602. For example, the command decoder 606 is used to generate internal control signals to read data from and write data to the memory array 602. Row and column address signals are applied to the memory 600 through an address bus 620 and provided to an address latch 610. The address latch 610 then outputs a separate column address and a separate row address.

The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines corresponding to a received column address are coupled to a read/write circuitry 630 to provide read data to a data output buffer 634 via an input-output data bus 640. Write data are applied to the memory array 602 through a data input buffer 644 and the memory array read/write circuitry 630.

The input data buffer 644 may receive data from a memory controller (not shown), for example, for storing in the array 602 in response to a write command, for example. The output buffer 634 may provide data stored in the array 602 to the memory controller in response to a read command, for example.

In some embodiments, the input data buffer 644 may be coupled to a reference voltage generator (VREFGEN) 600. VREFGEN 600 may be implemented according to an embodiment disclosed herein, for example, the reference voltage generator 200 illustrated in FIG. 2 or the reference voltage generator 500 illustrated in FIG. 5. VREFGEN 600 may provide one or more reference voltages to the input data buffer 644. In some embodiments, the VREFGEN 600 may provide one or more reference voltages to an input data line of the input buffer 644. The one or more reference voltages may be used to calibrate the input data buffer 644. In some embodiments, a multiplexer (not shown) may couple VREFGEN 600 to input buffer 644. The multiplexer may apply a selected reference voltage of the one or more reference voltages from VREFGEN 600 to input buffer 644. In some embodiments, the input buffer 644 may include multiple input buffers, and one or more reference voltages may be provided to the multiple input buffers from VREFGEN 600. Other configurations may also be used.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
a multiplexer configured to receive a plurality of voltages and provide a selected voltage;
an operational amplifier configured to receive the selected voltage at a non-inverting input and provide a first reference voltage from an output;
a resistor coupled to the output of the operational amplifier;
a first adjustable resistor coupled to the resistor, wherein a second reference voltage is provided from between the resistor and the first adjustable resistor;
a capacitor coupled to the output of the operational amplifier and between the resistor and the first adjustable resistor; and
a second adjustable resistor coupled to the first adjustable resistor and to an inverting input of the operational amplifier, the second adjustable resistor configured to maintain a constant current through the resistor.

2. The apparatus of claim 1, further comprising:
a voltage divider configured to receive an input voltage and divide the input voltage to provide the plurality of voltages, wherein the multiplexer is coupled to the voltage divider and configured to receive the plurality of voltages and select a voltage from the plurality of voltages and provide the selected voltage to the operational amplifier.

3. The apparatus of claim 2, further comprising a controller coupled to the multiplexer, wherein the controller is configured to control the multiplexer to select the selected voltage received by the operational amplifier.

4. The apparatus of claim 2, wherein the voltage divider comprises a plurality of resistors coupled in series.

5. The apparatus of claim 1, further comprising a plurality of resistors coupled in series between the resistor and the first adjustable resistor, wherein reference voltages are provided from between adjacent ones of the plurality of resistors.

6. The apparatus of claim 5, wherein the reference voltages provided from between adjacent ones of the plurality of resistors are different voltages.

7. The apparatus of claim 1, wherein a voltage difference between the first reference voltage and the second reference voltage is constant.

8. The apparatus of claim 1, wherein the first and second adjustable resistors are trimmed resistors.

9. The apparatus of claim 1, further comprising a second resistor and a capacitor coupled in series between the output of the operational amplifier and a negative voltage supply.

10. An apparatus comprising:
a multiplexer configured to receive a plurality of voltages and provide a selected voltage;
an operational amplifier configured to receive the selected voltage at a non-inverting input and provide a first reference voltage from an output. wherein the operational amplifier is a Class AB operational amplifier;
a resistor coupled to the output of the operational amplifier;
a first adjustable resistor coupled to the resistor, wherein a second reference voltage is provided from between the resistor and the first adjustable resistor; and
a second adjustable resistor coupled to the first adjustable resistor and to an inverting input of the operational amplifier, the second adjustable resistor configured to maintain a constant current through the resistor.

11. The apparatus of claim 10, further comprising a capacitor coupled to the output of the operational amplifier and between the resistor and the first adjustable resistor.

12. An apparatus comprising:
a multiplexer configured to receive a plurality of voltages and provide a selected voltage;
an operational amplifier configured to receive the selected voltage at a non-inverting input and provide a first reference voltage from an output;
a first resistor coupled to the output of the operational amplifier;
a second resistor and a capacitor coupled in series between the output of the operational amplifier and a negative voltage supply;
a first adjustable resistor coupled to the first resistor, wherein a second reference voltage is provided from between the first resistor and the first adjustable resistor; and
a second adjustable resistor coupled to the first adjustable resistor and to an inverting input of the operational amplifier, the second adjustable resistor configured to maintain a constant current through the first resistor.

13. The apparatus of claim 12, wherein the operational amplifier is a Class AB operational amplifier.

* * * * *